(12) United States Patent
Chen et al.

(10) Patent No.: US 7,956,526 B2
(45) Date of Patent: Jun. 7, 2011

(54) ORGANIC ELECTRO-LUMINESCENCE DEVICE WITH ORGANIC LIGHT EMITTING LAYER HAVING PARTICULAR RATIO OF CONTENTS

(75) Inventors: Fang-Chung Chen, Hsinchu County (TW); Yung-Shiuan Chen, Taipei (TW); Shang-Chieh Chien, Taipei County (TW); Chi-Neng Mo, Taoyuan County (TW); Chien-Lung Tsou, Taoyuan County (TW); Jan-Tian Lian, Keelung (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 183 days.

(21) Appl. No.: 12/322,760

(22) Filed: Feb. 5, 2009

(65) Prior Publication Data
US 2010/0141121 A1    Jun. 10, 2010

(30) Foreign Application Priority Data
Dec. 5, 2008  (TW) ............................... 97147405 A

(51) Int. Cl.
H01J 1/62      (2006.01)
H01J 63/04     (2006.01)
(52) U.S. Cl. ......... 313/503; 313/498; 313/504; 313/506
(58) Field of Classification Search .......... 313/498–512; 428/690, 917
See application file for complete search history.

(56) References Cited

U.S. PATENT DOCUMENTS

| 2004/0056589 A1* | 3/2004 | Yamazaki et al. | 313/506 |
| 2004/0072018 A1* | 4/2004 | Herron et al. | 428/690 |
| 2004/0214037 A1* | 10/2004 | Roberts et al. | 428/690 |
| 2004/0247934 A1* | 12/2004 | Takeuchi et al. | 428/690 |
| 2005/0064241 A1* | 3/2005 | Kambe et al. | 428/690 |
| 2005/0221124 A1* | 10/2005 | Hwang et al. | 428/690 |

FOREIGN PATENT DOCUMENTS

CN          1505450         6/2004

OTHER PUBLICATIONS

Chinese First Examination Report of China Application No. 200910111362.7, dated Jun. 13, 2010.

* cited by examiner

Primary Examiner — Karabi Guharay
Assistant Examiner — Kevin Quarterman
(74) Attorney, Agent, or Firm — J.C. Patents

(57) ABSTRACT

An organic electro-luminescence device including an anode, a cathode, an organic light emitting layer and a hole-transporting layer is provided. The cathode has a calcium electrode and an aluminum electrode adjacent thereto. The organic light emitting layer is disposed between the anode and the calcium electrode, and has a polymer, a phosphorescence dopant and an organic electron-transporting material, wherein a ratio of contents of the organic electron-transporting material to contents of the polymer in the organic light emitting layer is substantially between 0.1 and 1. The organic electron-transporting material is 1,3-bis(N,Nt-butyl-phenyl)-1,3,4-oxadiazole. The hole-transporting layer is disposed between the light emitting layer and the anode.

10 Claims, 4 Drawing Sheets

ORGANIC ELECTRO-LUMINESCENCE DEVICE WITH ORGANIC LIGHT EMITTING LAYER HAVING PARTICULAR RATIO OF CONTENTS

CROSS-REFERENCE TO RELATED APPLICATION

This application claims the priority benefit of Taiwan application serial no. 97147405, filed Dec. 5, 2008. The entirety of the above-mentioned patent application is hereby incorporated by reference herein and made a part of this specification.

BACKGROUND OF THE INVENTION

1. Field of the Invention

The present invention is related to a luminescence device and more particularly to an organic electro-luminescence device.

2. Description of Related Art

Displays having the features of light weight and high efficiency, such as liquid crystal displays (LCDs), have now been extensively developed. However, LCDs still have many problems that are yet to be overcome, such as limited viewing angle and unsatisfactory response time. Due to these problems, LCDs are not suitable for displaying high-speed motion pictures, and LCDs require backlight plates which increases power consumption.

In recent years, the technology of flat-panel display, i.e. organic electro-luminescence display, has been developed to solve the foregoing problems. Compared with other types of flat-panel display technology, an organic electro-luminescence display has potential to become the mainstream in the next generation, for it has the advantages of self-luminescence, no viewing angle dependence, power saving, simple manufacturing process, low costs, low working temperature, quick response speed, and full color.

The organic electro-luminescence display is a device which utilizes the luminescence properties of organic luminescence materials to achieve display effects, and is mainly constituted by a pair of electrodes and an organic light emitting layer, wherein the organic light emitting layer includes organic light emitting materials. When current passes through an anode and a metallic cathode, electrons and holes are combined in the light emitting materials to generate excitons, which transform the energy therein into light for display effects.

In an organic polymer luminescence device, the organic light emitting layer is usually formed by mixing more than two types of materials, such as polymer and small molecule, so as to obtain favorable light emission efficiency. However, when a separation phenomenon occurs between the materials of the organic light emitting layer, the light emission efficiency of the polymer device would be greatly reduced. More specifically, if the mixture of the polymer and small molecule is not proper, energy cannot be effectively transferred between the polymer and the small molecule. In addition, if the materials forming the organic light emitting layer occur phase separation phenomenon, the surface of the whole organic light emitting layer becomes uneven, which causes electric leakage and decreases the light emission efficiency.

Conventionally, CsF/Al is adopted to form a stacked electrode which serves as the cathode. The light emission efficiency of the organic electro-luminescence device is very sensitive to the thickness of the CsF layer in the cathode. For instance, the performance of the whole device may be greatly impaired if the CsF layer is too thin or too thick. For this reason, the control of the fabricating process of the organic electro-luminescence device is crucial. Any variations to the thickness of the CsF layer may impair the yield and reproducibility.

Therefore, in addition to brightness and light emission efficiency, the difficulty in process control and production costs should also be taken into consideration when fabricating the organic electro-luminescence device. How to enhance the brightness and light emission efficiency and meanwhile increase production quantity to maintain the yield and reproducibility has become an important issue.

SUMMARY OF THE INVENTION

The present invention provides an organic electro-luminescence device which satisfies the requirements of light emission efficiency and mass production.

The present invention provides an organic electro-luminescence device, including an anode, a cathode, an organic light emitting layer, and a hole-transporting layer. The cathode has a calcium electrode and an aluminum electrode adjacent thereto. The organic light emitting layer is disposed between the anode and the calcium electrode, wherein materials of the organic light emitting layer include a polymer, a phosphorescence dopant, and an organic electron-transporting material. Specifically, a ratio of contents of the organic electron-transporting material to contents of the polymer in the light emitting layer is between 0.1 and 1, and the organic electron-transporting material is 1,3-bis(N,Nt-butyl-phenyl)-1,3,4-oxadiazole, for example. The hole-transporting layer is disposed between the light emitting layer and the anode.

In an embodiment of the present invention, the ratio of contents of the organic electron-transporting material to contents of the polymer in the light emitting layer is substantially equal to 0.4.

In an embodiment of the present invention, the ratio of contents of the organic electron-transporting material to contents of the polymer in the light emitting layer is substantially equal to 0.7.

In an embodiment of the present invention, a material of the aforesaid polymer is polyvinyl carbazole (PVK).

In an embodiment of the present invention, the aforementioned phosphorescence dopant is iridium(III) bis[(4,6-difluorophenyl)-pyridinate-N,$C^{2'}$]pinacolate (Firpic).

In an embodiment of the present invention, the aforementioned phosphorescence dopant is a guest of the organic light emitting layer.

In an embodiment of the present invention, a ratio of contents of the phosphorescence dopant to contents of the polymer in the organic light emitting layer is substantially equal to 0.1.

In an embodiment of the present invention, the aforementioned organic electron-transporting material is dispersed between the polymer and the phosphorescence dopant by a physical force.

In an embodiment of the present invention, a material of the anode is indium tin oxide.

In an embodiment of the present invention, a work-function of the calcium electrode is substantially 3.0 eV, and a work-function of the aluminum electrode is substantially 4.2 eV.

In an embodiment of the present invention, the ratio of contents of the organic electron-transporting material to contents of the polymer in the organic light emitting layer is equal to a weight percentage thereof.

Based on the above, the present invention increases the efficiency of energy transfer between the polymer and the phosphorescence dopant in the organic light emitting layer by adding organic electron-transporting materials, such as OXD-7, of appropriate proportion thereinto. Consequently, the light emission efficiency of the organic electro-luminescence device is enhanced. In addition, the calcium electrode and the aluminum electrode on the organic light emitting layer are used as the cathode, so as to prevent the conventional problems of low yield and reproducibility which result from the difficulty in controlling the thickness of CsF.

To make the above and other objectives, features, and advantages of the present invention more comprehensible, preferable embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
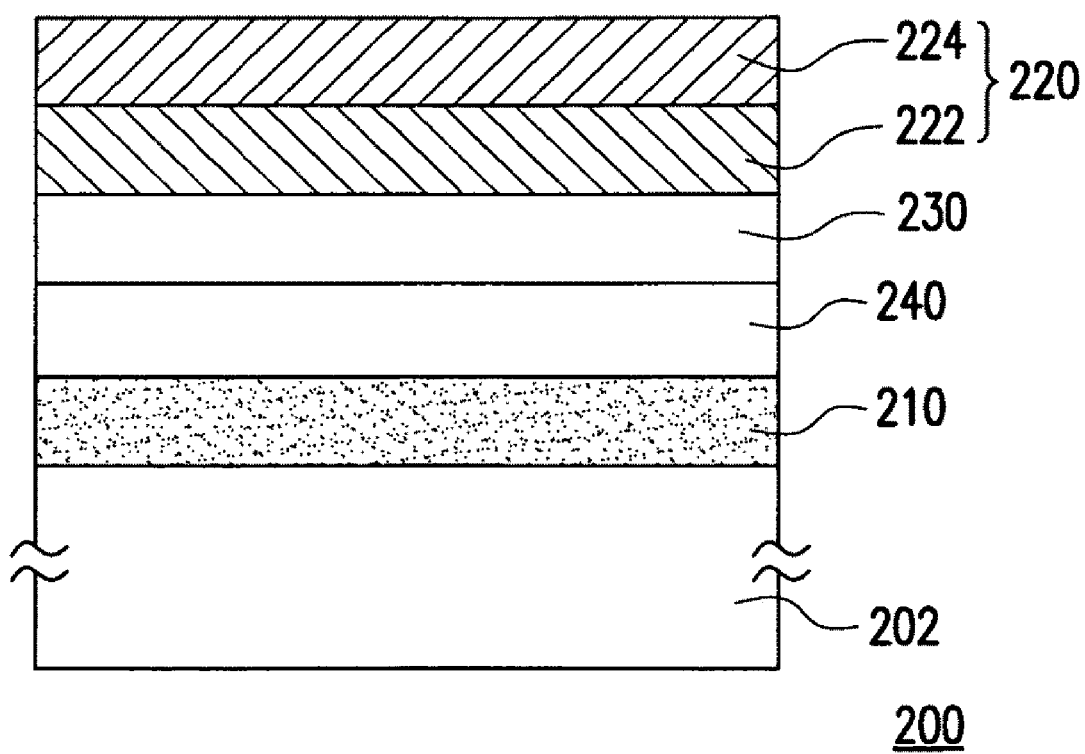
FIG. 1 is a cross-sectional view of an organic electro-luminescence device according to a preferred embodiment of the present invention.

FIG. 1 is a cross-sectional view of an organic electro-luminescence device according to a preferred embodiment of the present invention. Referring to FIG. 1, an organic electro-luminescence device 200 includes an anode 210, a cathode 220, an organic light emitting layer 230, and a hole-transporting layer 240. The anode 210 is disposed on a substrate 202, wherein a material of the anode 210 is, for example, indium tin oxide. The cathode 220 is disposed above the anode 210 and includes a calcium electrode 222 and an aluminum electrode 224 adjacent to the calcium electrode 222. The organic light emitting layer 230 is disposed between the anode 210 and the calcium electrode 222, and the hole-transporting layer 240 is located between the -organic light emitting layer 230 and the anode 210. As shown in FIG. 1, the materials which form the organic light emitting layer 230 include a polymer, a phosphorescence dopant, and an organic electron-transporting material, wherein the polymer is polyvinyl carbazole (PVK) and the phosphorescence dopant is iridium(III) bis[(4,6-difluorophenyl)-pyridinate-N,$C^{2'}$]pinacolate, for example.

It is noted that, according to the present invention, a ratio of contents of the organic electron-transporting material to contents of the polymer in the organic light emitting layer 230 is between 0.1 and 1. Furthermore, the ratio of contents of the organic electron-transporting material to the polymer in the organic light emitting layer 230 is calculated based on weight percentage, for instance. Certainly, the said ratio may also be calculated based on mole percentage, and the present invention is not limited thereto. In other words, addition of the organic electron-transporting material of appropriate proportion into the organic light emitting layer 230 helps to increase the efficiency of energy transfer between the polymer and the phosphorescence dopant, and further enhance the light emission efficiency of the organic electro-luminescence device 200. To be more specific, the polymer is used as a host of the organic light emitting layer 230 while the phosphorescence dopant serves as a guest. The organic light emitting layer 230 enables the guest, the phosphorescence dopant, to emit light via the energy transfer generated by the host, the polymer.

Specifically, a chemical formula of the organic electron-transporting material, e.g. 1,3-bis(N,Nt-butyl-phenyl)-1,3,4-oxadiazole, is illustrated as follows:

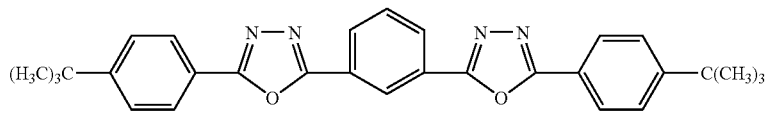

That is, the organic electron-transporting material is, for example, [2-(4-Biphenylyl)-5-(4-tert-butylphenyl)-1,3,4-oxadiazole, PBD]:

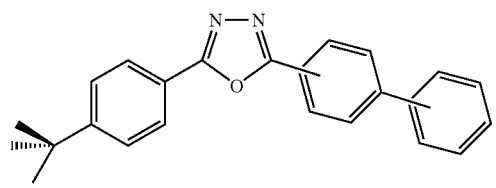

The organic electron-transporting material has electrical conductivity. When properly added into the organic light emitting layer 230, the organic electron-transporting material furnishes the organic light emitting layer 230 with the capability to transport electrons therethrough. Specifically, organic electron-transporting molecules are distributed between each polymer host and each phosphorescence dopant molecule in the organic light emitting layer 230 by a physical force, wherein the physical force is a Van Der Waals' force, for example. In other words, the organic electron-transporting molecules may serve as a bridge between the polymer hosts and the corresponding phosphorescence dopant molecules, so as to reduce energy loss during energy transfer and enhance the light emission efficiency of the organic electro-luminescence device 200. On the other hand, the addition of the organic electron-transporting material into the organic light emitting layer 230 helps to reduce the phase separation between the polymer and the phosphorescence dopant. Accordingly, energy transfer between the polymer and the phosphorescence dopant may proceed smoothly, and energy loss between two phase interfaces is prevented.

Actual data is provided below for illustrating the light emission efficiency and spectrum of the organic electro-luminescence device 200 of the present invention. In this embodiment, a ratio of contents of the phosphorescence dopant to the polymer in the organic light emitting layer is set to be 0.1 substantially, and the contents of the polymer and the phosphorescence dopant in the organic light emitting layer 230 are fixed. The only variable is the content of the organic electron-transporting material in the organic light emitting layer 230.

TABLE 1

| Organic electro-luminescence device | Content of organic electron-transporting material/content of polymer | Maximum light emission efficiency (cd/A) | Maximum light luminous efficiency (lm/W) | Maximum external quantum efficiency (%) |
|---|---|---|---|---|
| A | 10/100 | 2.68 | 0.91 | 1.04 |
| B | 40/100 | 7.18 | 2.02 | 3.47 |
| C | 70/100 | 16.52 | 5.51 | 7.88 |
| D | 100/100 | 11.27 | 2.24 | 4.25 |

Figure 2:
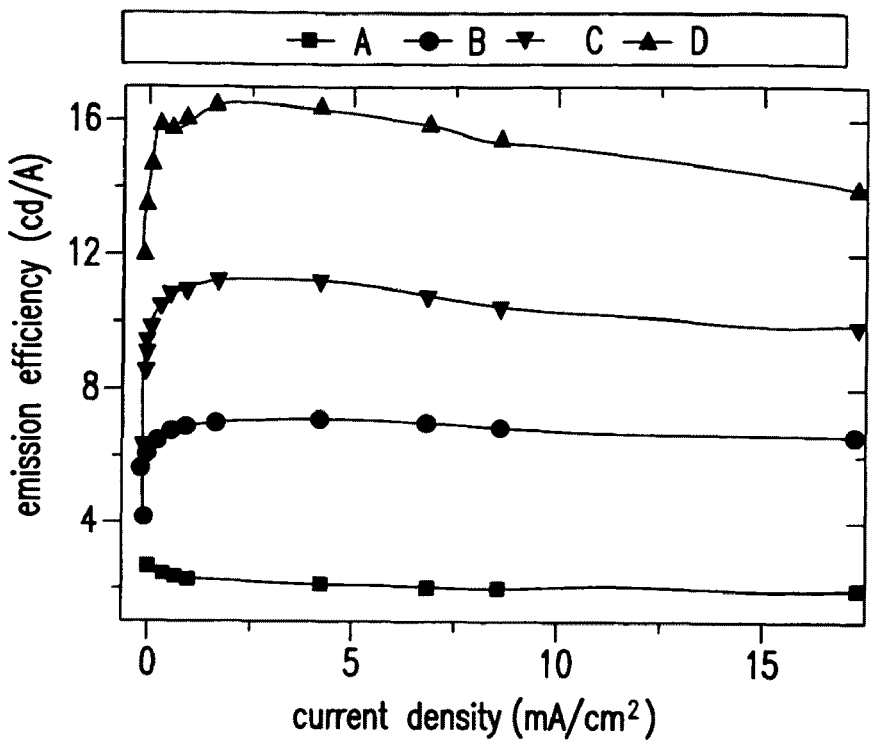
FIG. 2 illustrates the light emission efficiency of the organic electro-luminescence device having different contents of organic electron-transporting material in the present invention.
Figure 3:
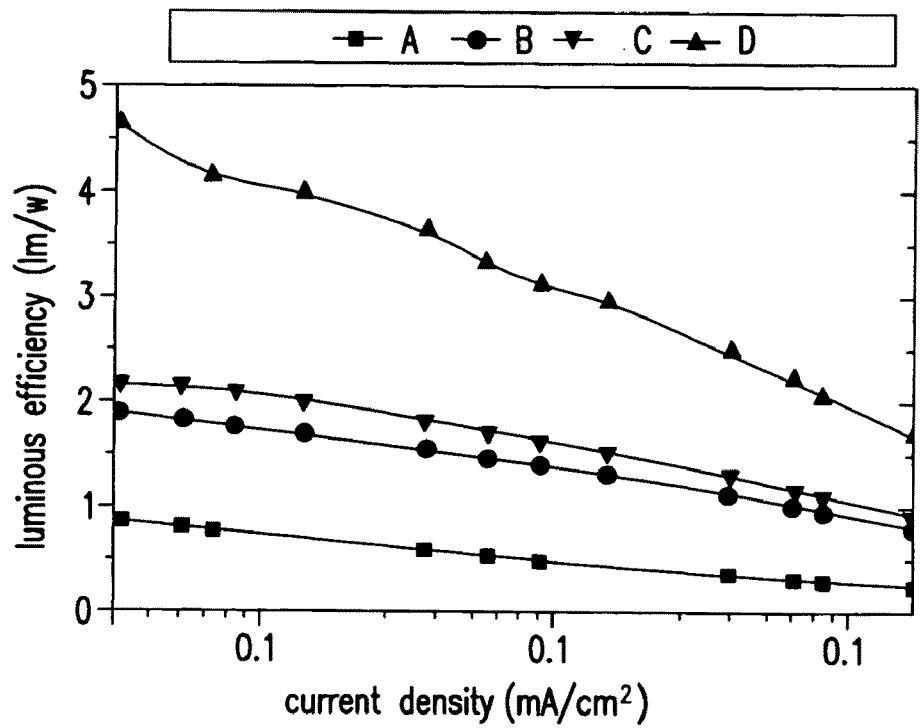
FIG. 3 illustrates the light luminous efficiency of the organic electro-luminescence device having different contents of organic electron-transporting material in the present invention.

Specifically, Table 1 illustrates the performances of several organic electro-luminescence devices in this embodiment. FIG. 2 and FIG. 3 respectively illustrate the light emission efficiency and light luminous efficiency of the organic electro-luminescence device having different contents of organic electron-transporting material in the present invention. With reference to Table 1, FIG. 2, and FIG. 3, in organic electro-luminescence devices A, B, C, and D, the contents of the polymer and the phosphorescence dopant are fixed, but the content of the organic electron-transporting material is varied. Further, the ratios of contents of the organic electron-transporting material to contents of the polymer in the organic electro-luminescence devices A, B, C, and D are 10%, 40%, 70%, and 100% respectively. As shown in Table 1, the ratio of contents of the organic electron-transporting material to the polymer in the organic light emitting layer 230 of the organic electro-luminescence device B is substantially equal to 0.4, while the ratio of the organic electro-luminescence device C is substantially 0.7.

Referring to Table 1 and FIG. 2, when the ratio of content of organic electron-transporting material/content of polymer is increased from 0.1 to 0.7, the light emission efficiency of the organic electro-luminescence device 200 is effectively improved. Although the organic electron-transporting material is contributive to the reduction of energy loss during energy transfer between the polymer and the phosphorescence dopant, it should be noted that an excessive addition of the organic electron-transporting material may overly aggregate the phosphorescence dopant in the organic light emitting layer 230 to result in spectrum red-shift. As a consequence, the light emission efficiency of the organic electro-luminescence device 200 may not be optimized. Therefore, in this embodiment, the ratio of content of organic electron-transporting material/content of polymer is 70/100 preferably.

The present invention provides the organic electron-transporting material as another option for constituting the organic light emitting layer 230 of the organic electro-luminescence device. Furthermore, with proper control of the proportion of the organic electron-transporting material and the polymer, the phase separation between polymer and small molecule which usually occurs in conventional technology is effectively suppressed. Thereby, the present invention is adapted for restraining phase separation phenomenon of materials in the organic light emitting layer, and further to enhance the light emission efficiency of the organic electro-luminescence device.

Figure 4A:
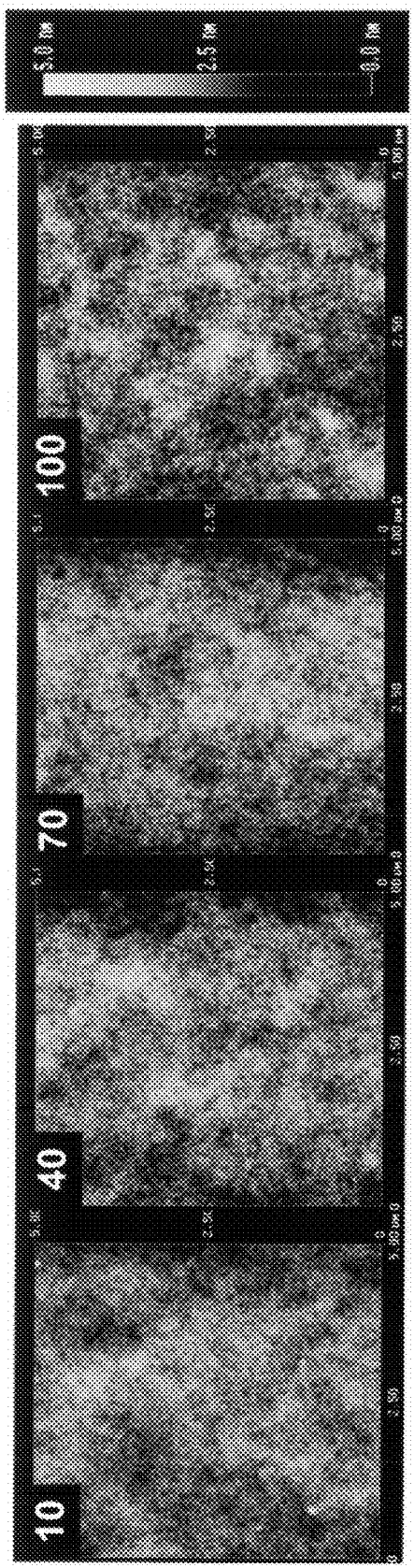
FIG. 4A illustrates height modes of the organic electro-luminescence device having different contents of organic electron-transporting material in the present invention, under observation of atomic force microscopy.
Figure 4B:
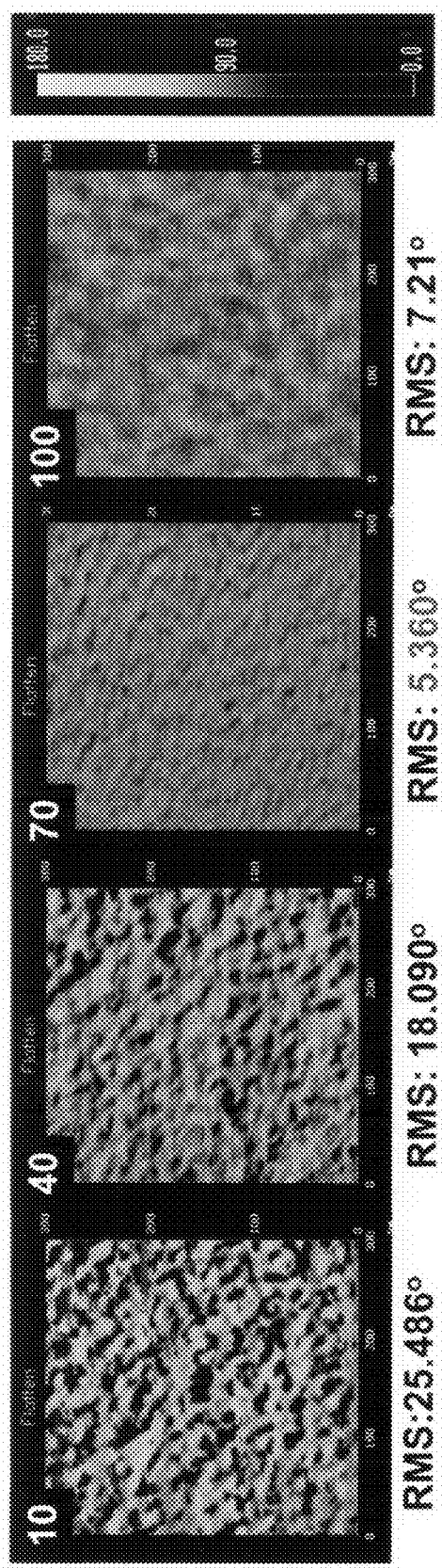
FIG. 4B illustrates phase modes of the organic electro-luminescence device having different contents of organic electron-transporting material in the present invention, under observation of atomic force microscopy.

FIG. 4A and FIG. 4B respectively illustrate height modes and phase modes of the organic electro-luminescence device having different contents of organic electron-transporting material in the present invention, under observation of atomic force microscopy, wherein the numbers 10, 40, 70, and 100 in FIGS. 4A and 4B represent that a proportion of the organic electron-transporting material to the polymer in the organic light emitting layer is 10%, 40%, 70%, and 100%, which have the same definition with the organic electro-luminescence devices A, B, C, and D as shown in Table 1. With reference to FIGS. 4A and 4B, the content of the organic electron-transporting material in the organic light emitting layer 230 affects topography of the organic light emitting layer 230, and the topography is also an important factor influencing the device performance. For measurement as shown in FIGS. 4A and 4B, an atomic force microscope (AFM) is adopted to observe a surface of the organic light emitting layer 230. In this embodiment, the organic electron-transporting material which serves as a basis for comparison is, for example, OXD-7, and the OXD-7 is 1,3-bis(N,Nt-butyl-phenyl)-1,3,4-oxadiazole.

As the ratio of content of organic electron-transporting material/content of polymer increases, the surface of the organic light emitting layer 230 becomes smooth. In this embodiment, a smoother surface of the organic light emitting layer 230 is obtained when the foregoing ratio is 0.7. Accordingly, the organic electron-transporting material is contributive to suppressing separation between the polymer and the phosphorescence dopant. Further, the phosphorescence dopant may be evenly distributed among the polymer to raise the efficiency of energy transfer between the polymer and the phosphorescence dopant. In addition, as shown in FIG. 4A, the organic electron-transporting material of proper content, such as OXD-7, may be added into the organic light emitting layer 230 to effectively improve the separation phenomenon.

With reference to Table 1, FIG. 2, and FIG. 3, in this embodiment, when the ratio of contents of the organic electron-transporting material and the polymer is 0.7, the organic electron-transporting material helps to effectively reduce the separation phenomenon in the organic light emitting layer 230, and the brightness and light emission efficiency of the device is enhanced.

In the present invention, referring to FIG. 1, the calcium electrode 222 and the aluminum electrode 224 are stacked to serve as the cathode 220, wherein the calcium electrode 222 is disposed between the aluminum electrode 224 and the organic light emitting layer 230, so as to match the work-functions of the adjacent layers for properly transmitting carriers therebetween and reducing energy loss. Specifically, a work-function of the calcium electrode 222 is substantially 3.0eV and a work-function of the aluminum electrode 224 is substantially 4.2eV. Moreover, the aluminum electrode 224 is further disposed on the calcium electrode 222 to prevent the calcium electrode 222 from being oxidized. To be more specific, based on operation mechanism of organic electro-luminescence device, electrons are introduced into the organic light emitting layer 230 from the cathode 220 to form negative ions, and holes are introduced into the organic light emitting layer 230 from the anode 210 to form positive ions. The positive ions and the negative ions move in directions towards each other and combine in the light emitting layer to form excitons. Further, a portion of the excitons in the light emitting layer release energy by means of electro-luminescence and return to a ground state thereof.

It is noted that, different from the conventional CsF layer, a thickness of the calcium electrode 222 of the present invention does not greatly influence the light emission efficiency of the organic electro-luminescence device 200, in other words, the thickness variation of the calcium electrode 222 in the present invention has more stable tendency to the light emission efficiency of the organic electro-luminescence device 200. In view of fabrication, slight variation to the thickness does not affect the yield and light emission efficiency of the organic electro-luminescence device 200. Hence, better product yield and reproducibility are achieved. That is to say, in consideration of industrial utilization, the cathode 220 of the present invention has the advantages of mass production, easily accessible materials, and lower production costs in comparison with the conventional technology.

In view of the fabrication of the organic electro-luminescence device 200 as shown in FIG. 1, the anode 210 is first formed by performing a sputtering process on the substrate 202, for example. Then, the hole-transporting layer 240 and the organic light emitting layer 230 are formed by performing a spin coating process on the anode 210. Thereafter, a thermal evaporation process is carried out to respectively form the calcium electrode 222 and the aluminum electrode 224 on the organic light emitting layer 230.

Certainly, the present invention is not restricted to the organic electro-luminescence device 200 having a four-layer structure as illustrated in FIG. 1, and may also be designed to be a five-layer structure or six-layer structure according to the actual requirements. Take one of the embodiments as an example, in addition to the anode 210, the hole-transporting layer 240, the organic light emitting layer 230, and the cathode 220, the organic electro-luminescence device 200 further includes a hole-injection layer disposed between the anode 210 and the hole-transporting layer 240. In another embodiment, in addition to the anode 210, the hole-transporting layer 240, the organic light emitting layer 230, and the cathode 220, the organic electro-luminescence device 200 further includes an electron-transporting layer disposed between the cathode 220 and the organic light emitting layer 230. In yet another embodiment, in addition to the anode 210, the hole-transporting layer 240, the organic light emitting layer 230, and the cathode 220, the organic electro-luminescence device 200 further includes an electron-injection layer disposed between the cathode 220 and the organic light emitting layer 230. The present invention does not restrict the materials used for forming the aforesaid hole-injection layer, electron-transporting layer, and electron-injection layer. Thus, materials used in the conventional technology may also be adopted. In addition, any one, any two, or all of the hole-injection layer, electron-transporting layer, and electron-injection layer may be adopted, so as to meet actual requirements.

In conclusion, the organic electro-luminescence device of the present invention has at least one, part, or all of the following advantages:

The present invention increases the efficiency of energy transfer between the polymer and the phosphorescence dopant in the organic light emitting layer by adding organic electron-transporting material of appropriate proportion into the organic light emitting layer. Consequently, the light emission efficiency of the organic electro-luminescence device is enhanced.

The present invention combines the organic light emitting layer with the cathode constituted by the calcium electrode and the aluminum electrode, so as to raise the fabrication yield and reproducibility of the organic electro-luminescence device and further increase industrial utilization.

Although the present invention has been disclosed by the above embodiments, they are not intended to limit the present invention. Persons having ordinary skill in the art may make modifications and alterations without departing from the spirit and scope of the present invention. Therefore, the protection range of the present invention falls in the appended claims.

What is claimed is:

1. An organic electro-luminescence device, comprising:
   an anode;
   a cathode having a calcium electrode and an aluminum electrode adjacent thereto;
   an organic light emitting layer disposed between the anode and the calcium electrode, wherein materials of the organic light emitting layer comprise a polymer, a phosphorescence dopant, and an organic electron-transporting material, and a ratio of contents of the organic electron-transporting material in the organic light emitting layer to contents of the polymer in the organic light emitting layer is between 0.1 and 1, and a ratio of contents of the phosphorescence dopant to contents of the polymer in the organic light emitting layer is substantially equal to 0.1, and the organic electron-transporting material is 1,3-bis(N,Nt-butyl-phenyl)-1,3,4-oxadiazole; and
   a hole-transporting layer disposed between the organic light emitting layer and the anode.

2. The organic electro-luminescence device as claimed in claim 1, wherein the ratio of contents of the organic electron-transporting material to contents of the polymer in the organic light emitting layer is substantially equal to 0.4.

3. The organic electro-luminescence device as claimed in claim 1, wherein the ratio of contents of the organic electron-transporting material to contents of the polymer in the organic light emitting layer is substantially equal to 0.7.

4. The organic electro-luminescence device as claimed in claim 1, wherein a material of the polymer is polyvinyl carbazole (PVK).

5. The organic electro-luminescence device as claimed in claim 1, wherein the phosphorescence dopant is iridium(III) bis[(4,6-difluorophenyl)-pyridinate-N,$C^{2'}$] pinacolate (Firpic).

6. The organic electro-luminescence device as claimed in claim 1, wherein the phosphorescence dopant is a guest of the organic light emitting layer.

7. The organic electro-luminescence device as claimed in claim 1, wherein the organic electron-transporting material is dispersed between the polymer and the phosphorescence dopant by a physical force.

8. The organic electro-luminescence device as claimed in claim 1, wherein a material of the anode is indium tin oxide.

9. The organic electro-luminescence device as claimed in claim 1, wherein a work-function of the calcium electrode is substantially 3.0 eV and a work-function of the aluminum electrode is substantially 4.2 eV.

10. The organic electro-luminescence device as claimed in claim 1, wherein the ratio of contents of the organic electron-transporting material to contents of the polymer in the organic light emitting layer is calculated based on weight percentage.

* * * * *